Oct. 28, 1969 J. L. BOYER 3,475,663

HIGH VOLTAGE GLASS SEALED SEMICONDUCTOR DEVICE

Filed Feb. 6, 1968

INVENTOR.
JOHN L. BOYER

BY

OSTROLENK, FABER, GERB & SOFFEN

ATTORNEYS

United States Patent Office
3,475,663
Patented Oct. 28, 1969

3,475,663
HIGH VOLTAGE GLASS SEALED SEMICONDUCTOR DEVICE

John L. Boyer, El Segundo, Calif., assignor to International Rectifier Corporation, Los Angeles, Calif., a corporation of California Filed Feb. 6, 1968, Ser. No. 703,369
Int. Cl. H01l 5/00, 3/00
U.S. Cl. 317—234 4 Claims

ABSTRACT OF THE DISCLOSURE

A semiconductor wafer positioned between two expansion plates is hermetically sealed by glass rings extending from the outer peripheries of each of the expansion plates and is sealed by fusion at its outer peripheries. The region of fusion is spaced from the wafer to form a long creepage path.

This invention relates to semiconductor devices and more particularly relates to a novel glass housing and method of manufacture therefor for a high voltage semiconductor device.

A primary object of this invention is to provide a novel glass housing for semiconductor device which provides a long internal creepage path across a semiconductor edge.

A further object of this invention is to provide a novel semiconductor housing structure which is easily manufactured.

Another object of this invention is to provide a novel hermetically sealed housing for semiconductor devices which can be mounted by pressure connection to massive conductors.

Another object of this invention is to provide a novel method of manufacture of a hermetically sealed housing for semiconductor devices.

These and other objects of my invention will become apparent from the following description taken in connection with the accompanying drawings, in which.

Figure 1:
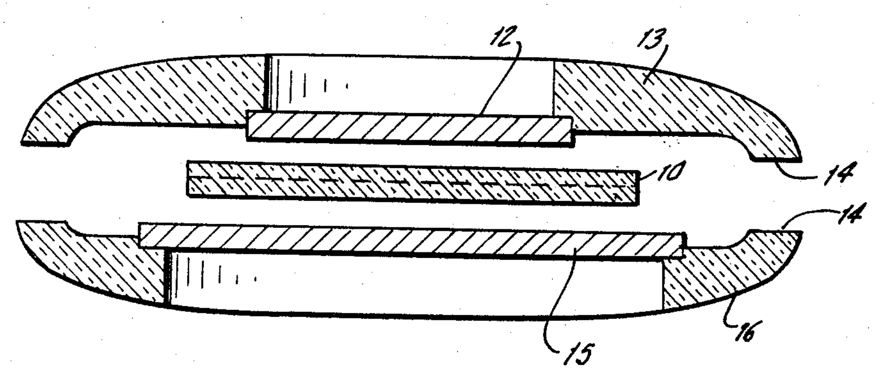
FIGURE 1 is an exploded cross-sectional view of a device made in accordance with the invention.
Figure 3:
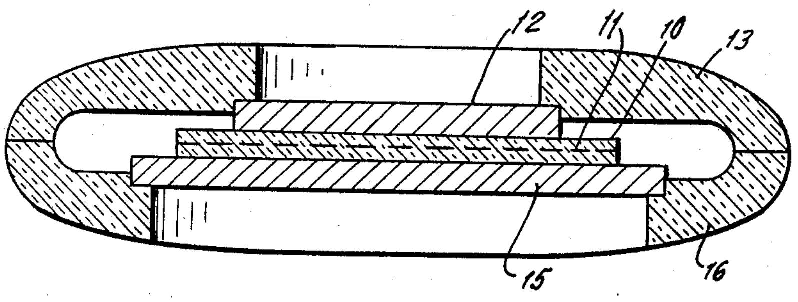
FIGURE 3 is a cross-sectional view of FIGURE 2 taken across section line 3—3 in FIGURE 2.
Figure 2:
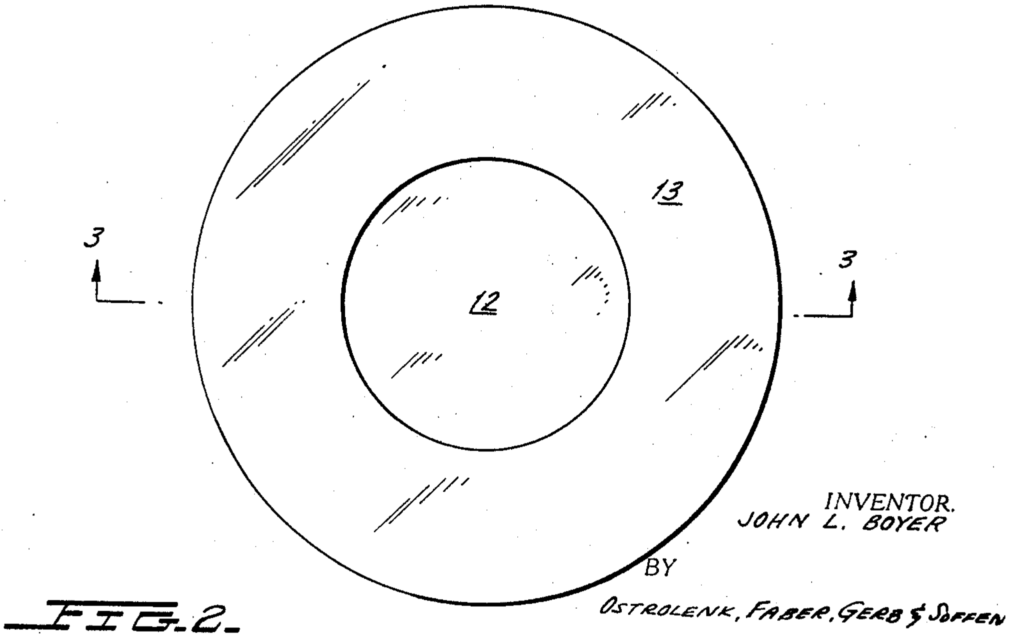
FIGURE 2 is a top plan view of the device of FIGURE 1 when assembled.

Referring now to the drawings, a semiconductor wafer 10, which may be of silicon is formed by standard techniques with a p-n junction 11 therein. Any desired number of junctions could be used, depending on the type semiconductor device to be fabricated with control leads taken through suitable sealed openings in the housing to be formed. Wafer 10 could have typical dimensions of a diameter of 1¼ inches and a thickness of 0.01 inch.

The upper expansion plate 12 of wafer 11, which may be of molybdenum or tungsten, or the like is, in a preassembly step, secured to a glass bead 13, as shown. Plate 12 could have dimensions of 1 inch in diameter and a thickness of 0.02 inch. Glass ring 13 may be formed of a low thermal expansion glass which is ground to the shape shown, having an outer diameter of about 2 inches, an inner diameter of ⅞ inch, and a total height of about ¼ inch. An annular flat 14 formed on glass ring 13 has a radial length of about ⅛ inch and extends below the bottom surface disk 12 by about 0.006 inch, depending on the thickness of wafer 10. The inner diameter of flat 14 is about 1¾ inches.

The glass ring 13 may be connected to plate 12 by cementing or by fusion under heat and pressure.

The lower expansion plate 15 is similar to disk 12, but has a diameter larger than that of wafer 10, and is about 1½ inches in diameter. A glass ring 16 is then secured to plate 15 in a manner identical to that for plate 12 and ring 13. Ring 16 is identical to ring 13 except that its inner diameter is larger; about 1⅞ inches to conform to the larger diameter of plate 15.

After the connection of rings 13 and 16 to plates 12 and 15, respectively, and the cleaning thereof, the wafer 10 is interposed between them as shown with the flats 14 of rings 13 and 16 lightly touching or slightly spaced. A relatively large pressure is then applied to rings 13 and 16, forcing them toward one another, as by a clamp, and the assemblage is placed in a furnace in an inert atmosphere. The furnace is heated to about 1000° C. for 3 minutes to cause fusing of the flats 14 to one another, thereby to hermetically seal rings 13 and 16 to one another around the wafer 10.

Note that this arrangement creates a long creepage path from the top surface to the bottom surface of the wafer, this being of great importance for the case of high voltage devices. Moreover, the arrangement permits the use of pressure connections of the type shown in U.S. Patent No. 3,293,508.

Instead of direct fusion of the glass flats 14, it will be apparent that the flats could be cemented. Moreover, the interfaces of wafer 10 and plates 12 and 15 could be soldered by their flat tin wafers inserted in the interfaces and soldered during the glass fusion step, or a subsequent heating step.

The use of such wafers will also assist in absorbing dimensional variations in the spacing of flats 14 when the device is assembled to insure a continuous peripheral seal at flats 14 and good connection between plates 12 and 15 and wafer 10.

Although this invention has been described with respect to its preferred embodiments, it will be understood that many variations and modifications will be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A high voltage semiconductor device comprising a wafer of semiconductor material, first and second expansion plates secured to the opposite surfaces of said semiconductor device; first and second glass rings having inner and outer peripheral portions; the said inner peripheral portions of said first and second rings fused to the outer peripheral portions of said first and second expansion plates respectively; said outer peripheral portions of said first and second rings fused together around an annular region spaced from the outermost periphery of said first and second plates and said wafer.

2. The device of claim 1, wherein said second expansion plate has a larger diameter than said first expansion plate.

3. The device of claim 2 wherein said wafer has a diameter equal to the diameter of said second expansion plate.

4. The method of manufacture of a semiconductor device comprising the connection of the inner peripheries of first and second glass rings to the outer peripheries of first and second expansion plates respectively; the positioning of a semiconductor wafer between said first and second expansion plates, and thereafter applying pressure to said first and second expansion plates to make contact thereof with the opposite surfaces of said wafer respectively, and thereafter applying heat to outer peripheral portions of said first and second glass rings to fuse said outer peripheries thereof to one another.

References Cited

UNITED STATES PATENTS

| | | | |
|---|---|---|---|
| 3,217,088 | 11/1965 | Steierman | 174—52 |
| 3,328,650 | 6/1967 | Boyer | 317—234 |

JOHN W. HUCKERT, Primary Examiner

R. F. POLISSACK, Assistant Examiner

U.S. Cl. X.R.

29—588, 589, 591